United States Patent
Zambrano et al.

[11] Patent Number: 5,804,486
[45] Date of Patent: Sep. 8, 1998

[54] PROCESS FOR MANUFACTURING A HIGH-FREQUENCY BIPOLAR TRANSISTOR STRUCTURE

[75] Inventors: Raffaele Zambrano, San Giovanni La Punta; Giuseppe Fallico, Acicastello, both of Italy

[73] Assignee: Consorzio per la Ricerca sulla Microelectronica nel Mezzogiorno, Catania, Italy

[21] Appl. No.: 811,616

[22] Filed: Mar. 5, 1997

Related U.S. Application Data

[62] Division of Ser. No. 549,267, Oct. 27, 1995.

[30] Foreign Application Priority Data

Oct. 28, 1994 [EP] European Pat. Off. .............. 94830512

[51] Int. Cl.$^6$ .................................................. H01L 21/331
[52] U.S. Cl. ......................... 438/309; 438/350; 438/365; 438/368
[58] Field of Search ...................... 438/350, 364, 438/365, 366, 367, 368, 309

[56] References Cited

U.S. PATENT DOCUMENTS

| | | | |
|---|---|---|---|
| 5,006,476 | 4/1991 | De Jong et al. | 437/31 |
| 5,198,372 | 3/1993 | Verret | 438/366 |
| 5,232,861 | 8/1993 | Miwa | 437/31 |
| 5,324,983 | 6/1994 | Onai et al. | 257/586 |

FOREIGN PATENT DOCUMENTS

| | | | |
|---|---|---|---|
| A-0 096 155 | 12/1983 | European Pat. Off. | H01L 21/28 |
| A-0 170 250 | 2/1986 | European Pat. Off. | H01L 21/22 |
| A-0 244 171 | 11/1987 | European Pat. Off. | H01L 29/72 |

OTHER PUBLICATIONS

European Search Report from European Patent Application No. 94830512.3, filed Oct. 28, 1994.

*Primary Examiner*—Tuan H. Nguyen
*Attorney, Agent, or Firm*—Wolf, Greenfield & Sacks, P.C.

[57] ABSTRACT

A high-frequency bipolar transistor structure includes a base region of a first conductivity type formed in a silicon layer of a second conductivity type, the base region comprising an intrinsic base region surrounded by an extrinsic base region, an emitter region of the second conductivity type formed inside the intrinsic base region, the extrinsic base region and the emitter region being contacted by a first polysilicon layer and a second polysilicon layer respectively. The first and the second polysilicon layers are respectively contacted by a base metal electrode and an emitter metal electrode. Between the extrinsic base region and the first polysilicon layer, a silicide layer is provided to reduce the extrinsic base resistance of the bipolar transistor.

5 Claims, 3 Drawing Sheets

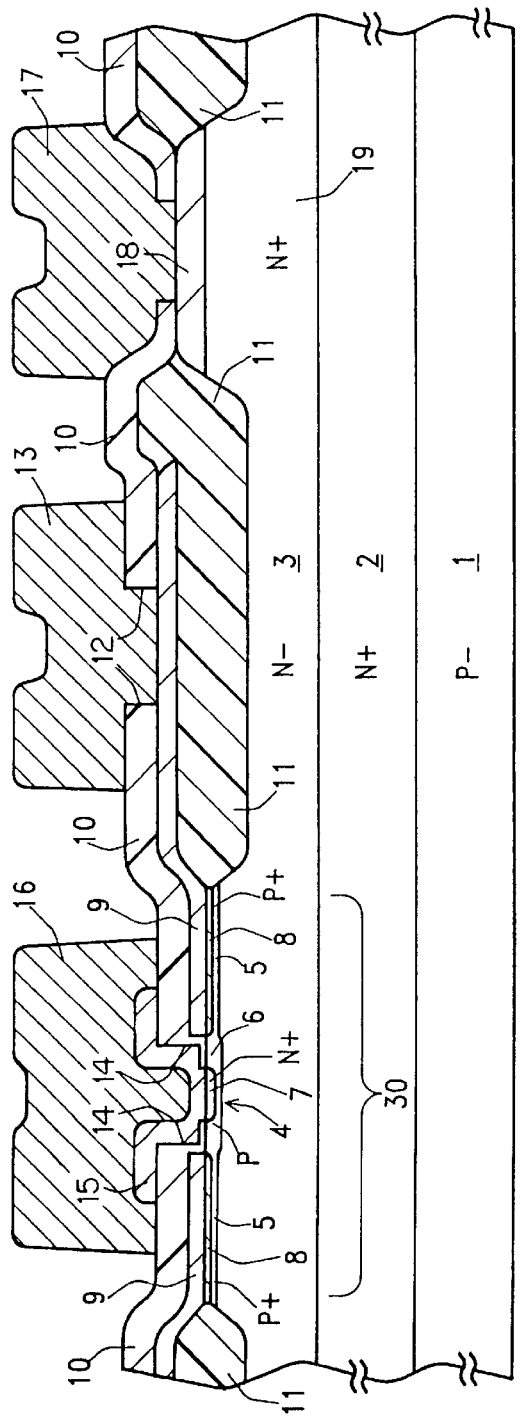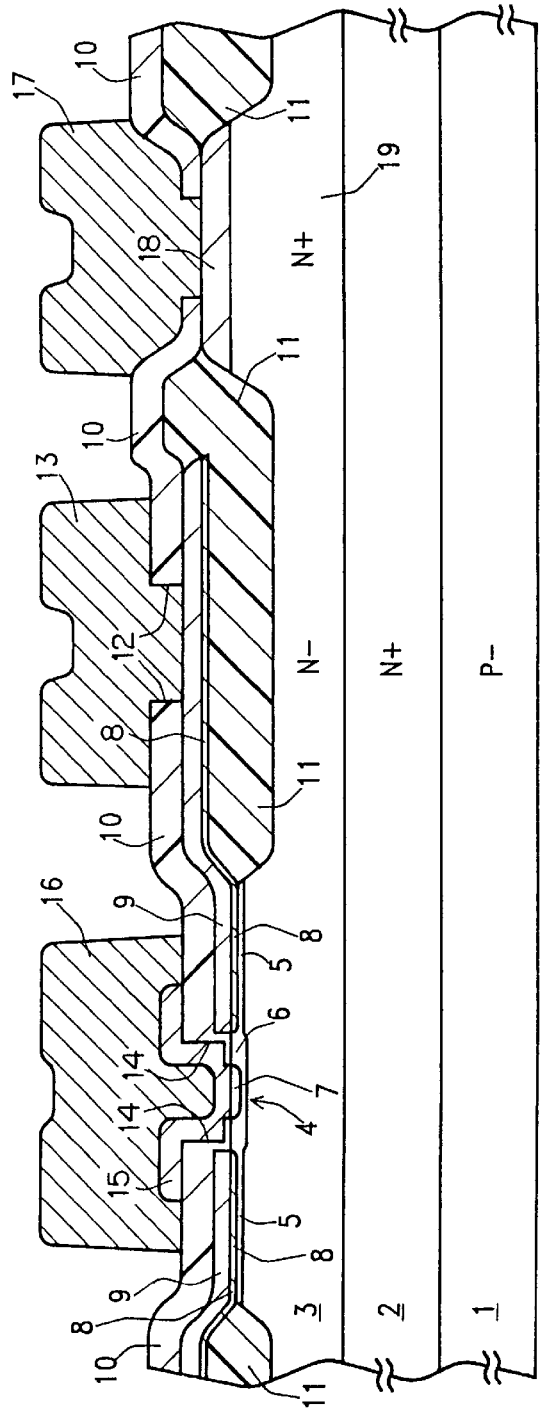

PROCESS FOR MANUFACTURING A HIGH-FREQUENCY BIPOLAR TRANSISTOR STRUCTURE

This application is a division of application Ser. No. 08/549,267, filed Oct. 27, 1995, entitled HIGH-FREQUENCY BIPOLAR TRANSISTOR STRUCTURE, AND RELATED MANUFACTURING PROCESS, now Pending

BACKGROUND OF THE INVENTION

1. Field of the Invention

The present invention relates to a high-frequency bipolar transistor structure, and to a related manufacturing process.

2. Discussion of the Related Art

Sophisticated techniques are employed to fabricate high-frequencies bipolar transistors, with cutoff frequency higher than 20 GHz, propagation delays below 40 ps and speed-power products of about 40 fJ. Such techniques involve, for example, dielectric or trench isolation, multiple polysilicon layers, self-aligned processes making use of $SiO_2$ or composite material spacers, rapid thermal processes (RTP), and so on.

High-performance Double PolySilicon Self-Aligned Transistors (DPSSATs) feature shallow junctions, with the emitter region formed by diffusion of dopants from an overlaying second polysilicon layer into the intrinsic base region; this last is surrounded by a heavily doped extrinsic base region, which is formed by diffusion of dopants from a first polysilicon layer into an epitaxial layer. The second and first polysilicon layers are respectively contacted by metal emitter and base electrodes. The intrinsic base can be formed by implantation, or by diffusion of dopants through the second polysilicon layer.

A review of such transistors can be found in P. C. Hunt, "Bipolar device design for high density high performance applications", Proceedings of IEDM 1989, 791–794, which is incorporated herein by reference.

To improve the AC performance of these transistors, their distributed base resistance ($r_{bb'}$) should be reduced. In this way, the charge/discharge time of the emitter-base junction capacitance would be decreased, and the dynamic behavior of the transistors improved. Further, the Noise Figure (NF) would be significantly reduced.

To further improve the speed performance the extrinsic base region should be shallower than the intrinsic base. The influence of the ratio of the extrinsic base to the intrinsic base junction depths is described in R. Dekker et al, "Charge Sharing Effects in Bipolar Transistors with Sub-half-micron Emitter Widths", Proceedings of IEDM 1990, 29–32, which is incorporated herein by reference. A shallower extrinsic base region would also allow a reduction in the base-collector junction parasitic capacitance, since the distance between the junction and the buried layer would increase, and the depletion region would be wider.

In view of the state of the art discussed, it is an object of the present invention to provide a high-frequency bipolar transistor structure with improved speed performance.

SUMMARY OF THE INVENTION

According to the present invention, such and other objects are attained by means of a high-frequency bipolar transistor structure, comprising a base region of a first conductivity type formed in a silicon layer of a second conductivity type, said base region comprising an intrinsic base region surrounded by an extrinsic base region, an emitter region of the second conductivity type formed inside said intrinsic base region, the extrinsic base region and the emitter region being respectively contacted by a first and a second polysilicon layers, said first and second polysilicon layers being respectively contacted by a base metal electrode and an emitter metal electrode, wherein between said extrinsic base region and said first polysilicon layer a silicide layer is provided to reduce the extrinsic base resistance of the transistor.

As a result of the present invention, a high-frequency bipolar transistor structure is provided with improved speed performance over the known transistor structures; the improvement is made possible by the presence of a silicide layer between the first polysilicon layer and the silicon surface, which reduces the distributed base resistance ($r_{bb'}$).

Also according to the present invention, a process for the manufacturing of a high-frequency bipolar transistor structure is provided, comprising the following steps:

a) selectively forming a thick field oxide region on a silicon layer of a first conductivity type;

b) forming a silicide layer at least over the silicon layer;

c) depositing over the entire structure a first polysilicon layer;

d) doping the first polysilicon layer with a dopant of a second conductivity type;

e) forming over the first polysilicon layer an oxide layer;

f) selectively removing the oxide layer, the first polysilicon layer and the silicide layer to open an emitter window over the silicon layer;

g) forming an intrinsic base region of the second conductivity type in the silicon layer under the emitter window;

h) forming insulating sidewall spacers at the edges of the emitter window;

l) depositing a second polysilicon layer over the silicon layer at the emitter window;

l) doping the second polysilicon layer with a dopant of a first conductivity type;

m) performing a thermal process to make the dopants in the first polysilicon layer and the second polysilicon layer diffuse into the silicon layer and the intrinsic base region, respectively, to form an extrinsic base region of the second conductivity type and an emitter region of the first conductivity type.

As a result of the process according to the invention, it is possible to fabricate a high-frequency bipolar transistor with low distributed base resistance, and with an extrinsic base region shallower than the intrinsic base region. In fact, the presence of the silicide layer prevents the dopant in the first polysilicon layer from diffusing deeply in the silicon layer. This further increases the speed of the bipolar transistor.

BRIEF DESCRIPTION OF THE DRAWINGS

The features of the present invention will be made more evident by the following detailed description of two particular embodiments, illustrated as non limiting examples in the annexed drawings, wherein:

FIG. 1 is a cross-sectional view of a high-frequency bipolar transistor integrated structure according to a first embodiment of the present invention;

FIG. 5 is a cross-sectional view of a high-frequency bipolar transistor integrated structure according to another embodiment of the present invention;

DETAILED DESCRIPTION

Figure 1A:
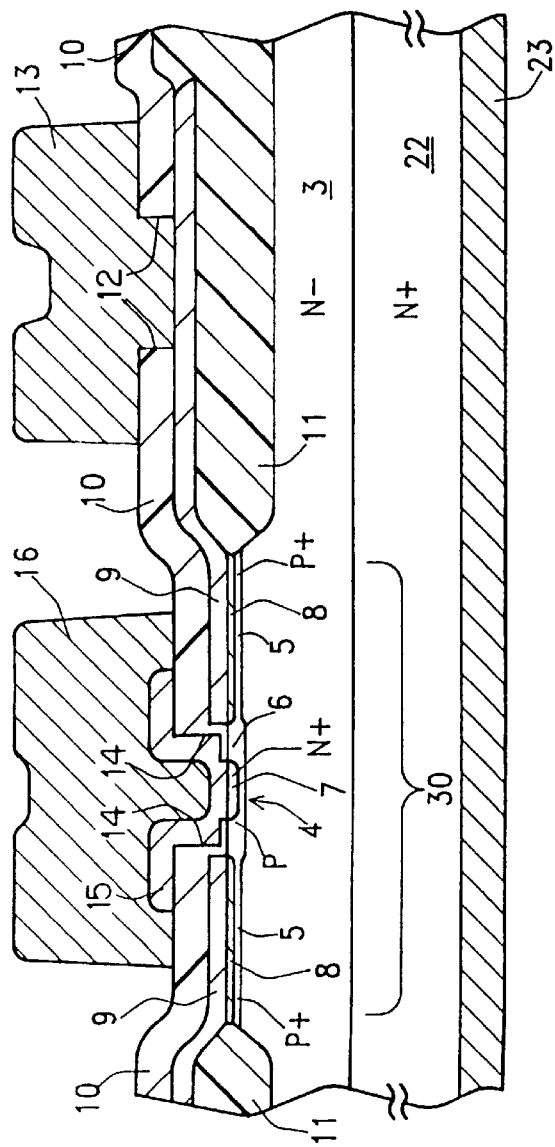
FIG. 1A is a variation of the structure of FIG. 1, showing a discrete high-frequency bipolar transistor.

FIG. 1 is a cross-sectional view of a high-frequency bipolar transistor integrated structure according to a first embodiment of the present invention. Such a structure comprises a lightly doped P type semiconductor substrate 1, over which a heavily doped N type buried layer 2 is provided. A lightly doped N type epitaxial layer 3 is further provided over the buried layer 2.

The bipolar transistor comprises a P type base region 4 formed in a portion 30 of the epitaxial layer 3 comprised between thick field oxide areas 11. The base region 4 comprises a heavily doped P type contact region 5 also called an "extrinsic base" region, which extends to the field oxide 11, and a lightly doped P type region 6 called an "intrinsic base" region. A heavily doped N type emitter region 7 is formed inside the intrinsic base region 6.

Over the extrinsic base region 5, a silicide layer 8 is provided; preferably, cobalt silicide ($CoSi_2$) is employed, but other silicides are suitable, such as tantalum silicide ($TaSi_2$), titanium silicide ($TiSi_2$) or tungsten silicide ($WSi_2$).

The properties of silicide and polycide films are well known; a good review of these materials can be found in S. M. Sze, "VLSI Technology", McGraw-Hill, 1983, 372–380, which is incorporated herein by reference.

The cobalt silicide layer 8 is covered by a polysilicon layer 9, doped with acceptor impurities, which is in turn covered by an oxide layer 10. The polysilicon layer 9 and the oxide layer 10 extend over the field oxide 11.

Over the field oxide area 11, a contact window 12 is provided in the oxide layer 10 to allow a base metal electrode 13 to contact the polysilicon layer 9.

Another window in the oxide layer 10 and in the underlying polysilicon layer 9 is provided over the intrinsic base region 6, and spacers 14 are formed at the edges of this window; as described in the already cited paper of P. C. Hunt, the spacers 14 can be made of oxide or, alternatively, of oxide and nitride. A first polysilicon portion 15, formed from a second polysilicon layer doped with donor impurities, contacts the emitter region 7 formed in the portion of the intrinsic base region 6 not covered by oxide. An emitter metal electrode 16 contacts the polysilicon strip 15.

A collector metal electrode 17 contacts a second portion 18 of the second polysilicon layer over a heavily doped N type sink region 19 formed in the epitaxial layer 3 and extending down to the buried layer 2.

The presence of the suicide layer 8 below the acceptor-doped polysilicon layer 9 which provides the contact to the extrinsic base region 5 allows for greatly reducing the distributed base resistance ($r_{bb'}$) of the bipolar transistor, because of the low sheet resistance of silicide (only a few Ohms/square) with respect to the relatively high sheet resistance of acceptor-doped polysilicon (several tens of Ohms/square). As already mentioned, a low base resistance means a reduced charge/discharge time of the emitter-base junction capacitance, and thus better dynamic behavior.

A process for the manufacturing of the bipolar transistor structure of FIG. 1 starts with the formation of the N+ buried layer 2 over the P– substrate 1, and with the epitaxial growth of the N– layer 3 over the buried layer 2.

The thick field oxide areas 11 are formed over the epitaxial layer 3 by means of the known LOCOS technique.

After the removal of the $Si_3N_4$ and pad oxide layers, a thin layer of cobalt is deposited over the entire surface of the structure (i.e. over the layer 3 and the field oxide 11); the cobalt layer can have a thickness of some hundreds of nanometers.

Figure 2:
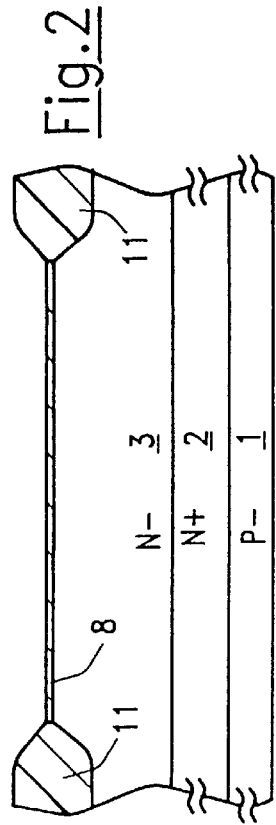
FIGS. 2 to 4 are cross-sectional views of a portion of the high-frequency bipolar transistor structure of FIG. 1, taken at intermediate steps of its manufacturing process.

The structure is then submitted to a thermal process. Where the cobalt layer is in contact with silicon, a cobalt silicide layer 8 is formed, whereas in the areas where the cobalt layer is superimposed over silicon dioxide 11, cobalt does not react and no silicide is formed. The cobalt layer is then removed from the silicon oxide 11 (FIG. 2).

The first polysilicon layer 9 is then deposited over the entire surface of the structure (i.e. over the cobalt silicide layer 8 and over the field oxide 11), and it is successively acceptor-doped by means of a boron implant; the oxide layer 10 is then formed over the polysilicon layer 9.

The oxide layer 10, the underlying polysilicon layer 9 and the silicide layer 8 are then selectively removed to open a window where the intrinsic base region is to be formed.

Figure 3:
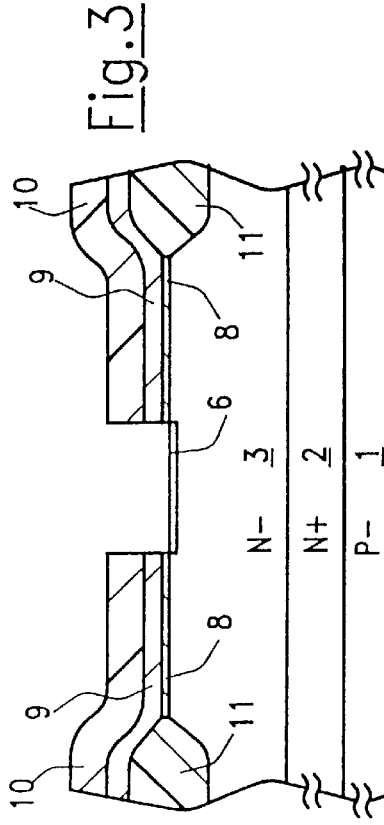

Acceptor ions are then implanted into the N– layer 3 using the oxide layer 10 as a mask, to form the intrinsic base region 6 (FIG. 3). Such an implanting step can be preceded by a growth of a thin thermal oxide layer. It is also possible not to form the intrinsic base region 6 at this step, and to define only a link-up region more lightly doped than the intrinsic base region 6, necessary to guarantee that the intrinsic and extrinsic base regions will be effectively linked.

It is worth noting that the presence of the suicide layer 8 also improves the etching process of the polysilicon layer 9. In conventional structures, wherein the polysilicon layer is in direct contact with silicon, the silicon is inevitably partially etched during the etching of the polysilicon layer.

Figure 4:
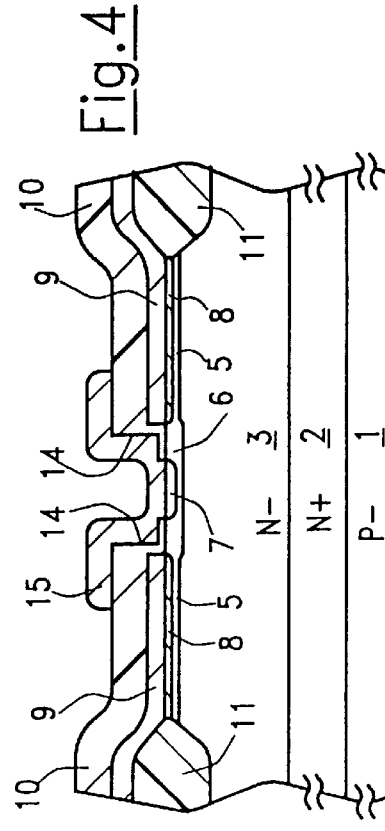

The process continues with the formation of the spacers 14, and the deposition of a second layer of polysilicon. This second layer of polysilicon is then donor-doped by implanting a heavy dose of As, to form the polysilicon emitter contact 15. The extrinsic base region 5 and the emitter region 7 are then diffused from the first polysilicon layer 9 and from the portion 15 of the second polysilicon layer into the N– layer 3 and the intrinsic base region 6, respectively (FIG. 4).

As shown in the drawings, the extrinsic base region 5 is shallower than the intrinsic base region 6, while in conventional structures the former was deeper than the latter. This is for two reasons. First, the intrinsic base region 6 is defined at the surface of the epitaxial layer 3, while the P type polysilicon layer 9, heavily doped, is separated from the surface of the layer 3 by the silicide layer 8. Second, the boron coming from the polysilicon layer 9 must pass through the silicide layer 8 before reaching the silicon surface.

The process ends with the definition of the contact areas to the first layer of polysilicon, and of the metallizations, to obtain the structure shown in FIG. 1.

Figure 5A:
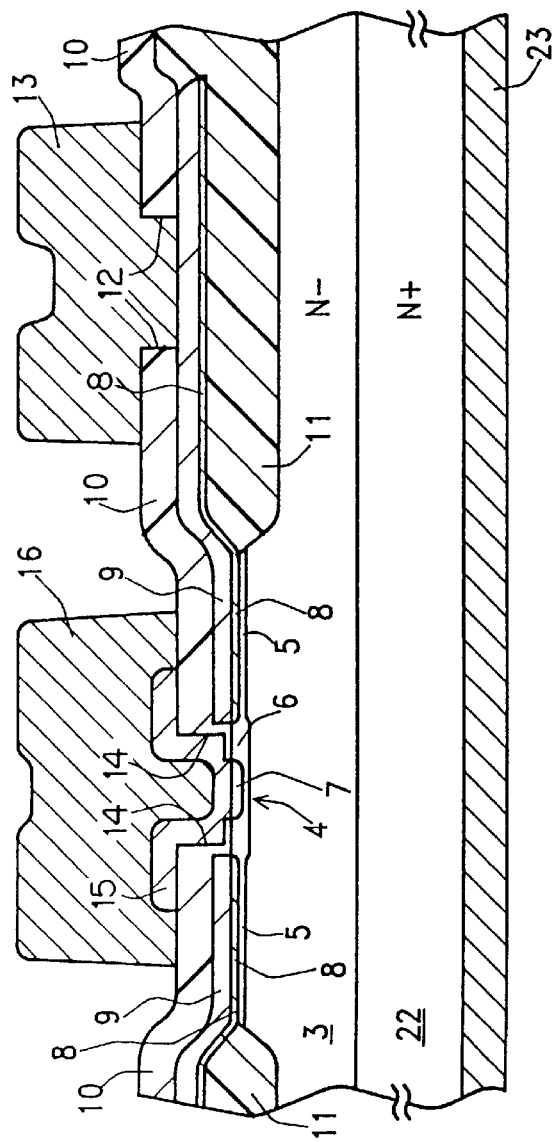
FIG. 5A is a variation of the structure of FIG. 5, again referred to a discrete high-frequency bipolar transistor.

FIG. 5 shows a cross-sectional view of a high-frequency bipolar transistor according to a second embodiment of the present invention. In this embodiment, the silicide layer under the polysilicon layer is not only provided over the silicon surface, but extends over the field oxide area. In this way, the base series resistance $r_{bb'}$ is further reduced; for this same reason, it is also possible to reduce the doping level of the first polysilicon layer, by means of a lighter implant; this also helps to reduce the depth of the extrinsic base region. In this second embodiment, titanium suicide, instead of cobalt suicide, has been employed.

A process for the manufacturing of a structure according to this second embodiment of the invention is analogous to the process previously described up to the formation of field oxide areas.

Figure 6:
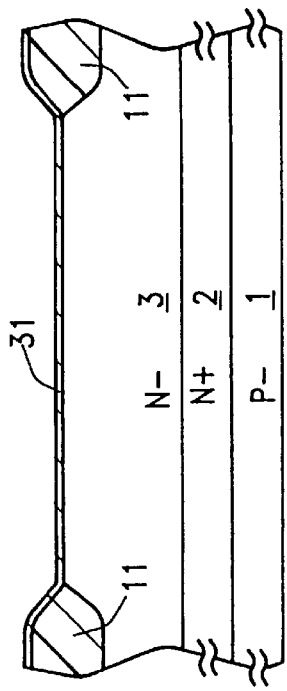
FIGS. 6 to 8 are cross-sectional views of a portion of the high-frequency bipolar transistor structure of FIG. 5, taken at intermediate steps of its manufacturing process.
Figure 7:
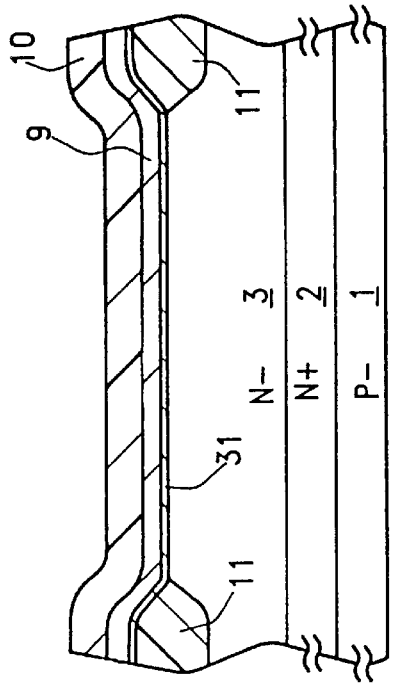
Figure 8:
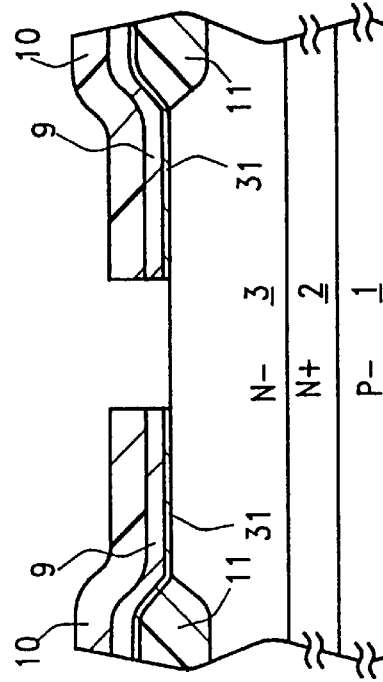

After the removal of $Si_3N_4$ and pad oxide used for the LOCOS process, a thin layer of titanium 31 is deposited over the entire surface of the structure (FIG. 6). Differently from the previous process, however, this step is not immediately followed by the formation of the silicide. Instead, the first polysilicon layer 9 is deposited over the titanium layer 31, and successively doped, and then the oxide layer 10 is deposited over the first polysilicon layer 9 (FIG. 7).

The successive steps are directed to the formation of the emitter window, by etching the oxide, polysilicon and titanium layers 10, 9 and 31. The titanium silicide layer is formed, after the emitter window has been opened, by submitting the structure to a thermal process.

It is also possible to form the titanium silicide layer 8 before the emitter window definition; in this case the etching affects the oxide, polysilicon and titanium silicide layers 10, 9 and 8.

Differently from the previous process, silicide is formed not only directly over silicon, but also over the field oxide areas, below the polysilicon layer.

From this point on, the process is substantially the same as the previously described process.

The teachings of this invention can be applied to the manufacture of high frequency bipolar discrete transistors. In such case, as can be seen from FIGS. 1A and 5A, the N-type epitaxial layer 3 is grown over a heavily doped N type substrate 22, and the collector metal electrode 23 can be moved on the back side of the wafer, on the surface opposite to the base and emitter metal electrodes 16 and 13, in contact with the heavily doped substrate 22.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for the manufacturing of a high-frequency bipolar transistor integrated structure, comprising the steps of:

a) selectively forming a thick field oxide region on a silicon layer of a first conductivity type;

b) forming a silicide layer at least over the silicon layer;

c) depositing over the entire structure a first polysilicon layer;

d) selectively doping a first polysilicon layer with a dopant of a second conductivity type;

e) forming over the first polysilicon layer an oxide layer;

f) selectively removing the oxide layer, the first polysilicon layer and the silicide layer to open an emitter window over the silicon layer;

g) forming an intrinsic base region of the second conductivity type in the silicon layer under said emitter window;

h) forming insulating sidewall spacers at the edges of emitter window;

I) depositing a second polysilicon layer over the silicon layer at the emitter window;

l) doping the second polysilicon layer with a dopant of a first conductivity type;

m) performing a thermal process to make the dopants in the first polysilicon layer a second polysilicon layer diffuse into the silicon layer and the intrinsic base region, respectively, to simultaneously form an extrinsic base region of the second conductivity type and an emitter region of the first conductivity type, the extrinsic base region being shallower than the intrinsic base region.

2. Process according to claim 1, wherein step b) is carried out by depositing a noble or refractory metal layer over the silicon layer and the field oxide region, and by performing a thermal process to make the noble or refractory metal layer react with the silicon layer to form a silicide layer.

3. Process according to claim 1, wherein step b) provides for depositing a noble or refractory metal layer over the silicon layer and over the field oxide region and, after the first polysilicon layer has been deposited over the noble or refractory metal layer and selectively etched away from designated areas, for performing a thermal process to make the noble or refractory metal react with the overlying first polysilicon layer, so that a silicide layer is formed over the silicon layer and over the field oxide region, under the polysilicon layer.

4. Process according to claim 3, wherein the noble or refractory metal layer is a titanium layer.

5. Process according to claim 1, wherein step g) is carried out by implanting a dopant of the second conductivity type into the silicon layer through the emitter window.

* * * * *

UNITED STATES PATENT AND TRADEMARK OFFICE
CERTIFICATE OF CORRECTION

PATENT NO. : 5,804,486
DATED : September 8, 1998
INVENTOR(S): Raffaele Zambrano and Giuseppe Fallico It is certified that error appears in the above-identified patent and that said Letters Patent is hereby corrected as shown below:

On the title page, item [73] should read:

[73] Assignee: Consorzio per la Ricerca sulla Microelettronica nel Mezzogiorno, Catania, Italy Signed and Sealed this First Day of December, 1998

*Attest:*

BRUCE LEHMAN

*Attesting Officer*     *Commissioner of Patents and Trademarks*